United States Patent
Takayama

(10) Patent No.: US 8,079,003 B2
(45) Date of Patent: Dec. 13, 2011

(54) VERIFICATION SUPPORT APPARATUS, VERIFICATION SUPPORT METHOD, AND COMPUTER PRODUCT

(75) Inventor: Koichiro Takayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 390 days.

(21) Appl. No.: 12/353,868

(22) Filed: Jan. 14, 2009

(65) Prior Publication Data

US 2009/0276741 A1 Nov. 5, 2009

(30) Foreign Application Priority Data

May 2, 2008 (JP) ................................. 2008-120577

(51) Int. Cl.
*G06F 9/455* (2006.01)

(52) U.S. Cl. ........................... 716/106; 716/51; 716/107

(58) Field of Classification Search ................... 716/106
See application file for complete search history.

(56) References Cited

U.S. PATENT DOCUMENTS 5,457,697 A * 10/1995 Malleo-Roach et al. ..... 714/726
7,216,318 B1 * 5/2007 Siarkowski ................... 716/104

FOREIGN PATENT DOCUMENTS

JP A 7-35828 2/1995
JP A 7-49887 2/1995

OTHER PUBLICATIONS

21. Saucier et el., "Partitioning with Cone Structures," Computer-Aided Design, 1993. ICCAD-93. Digest of Technical Papers., 1993 IEEE/ACM International Conference on, Nov. 7-11, 1993, pp. 236.*

* cited by examiner

*Primary Examiner* — Paul Dinh
*Assistant Examiner* — Bryce Aisaka
(74) *Attorney, Agent, or Firm* — Greer, Burns & Crain, Ltd.

(57) ABSTRACT

In a verification support apparatus, an implementation description of a verification target is acquired and based on the implementation description, a combination of input gates is identified. A pair of output cones including gates to which input signals from the input gates reach, and a common output cone including gates common to the pair of output cones, are detected. Based on the common output cone, a degree of relation between the input gates is calculated and according to the calculation, the strength of relation is determined for the combination of input gates. The strength of relation for a combination of the input gates is set, the combination being based on a specification of the verification target and corresponding to the combination identified from the implementation description. Whether the strength of relation set and that determined for the identified combination coincide is judged and a result of the judgment is output.

7 Claims, 19 Drawing Sheets

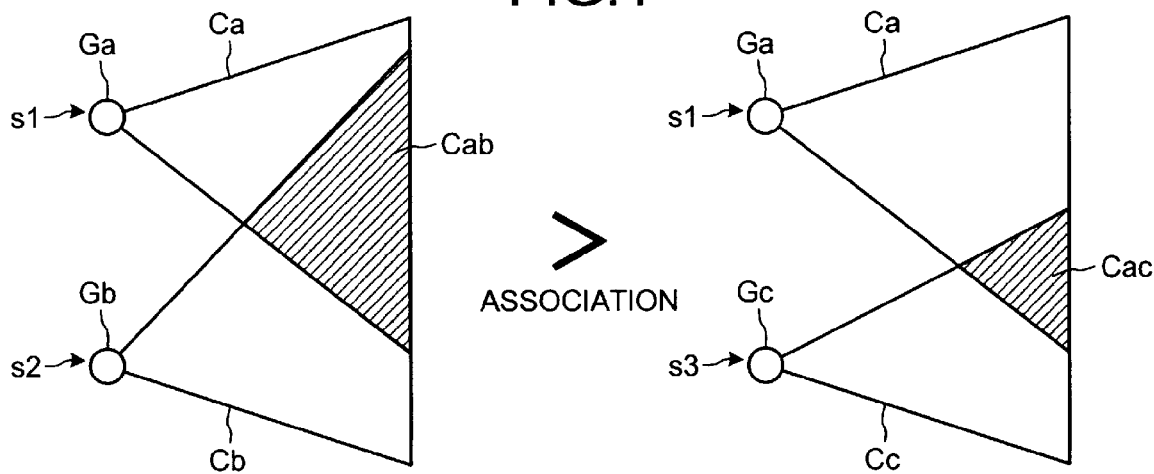
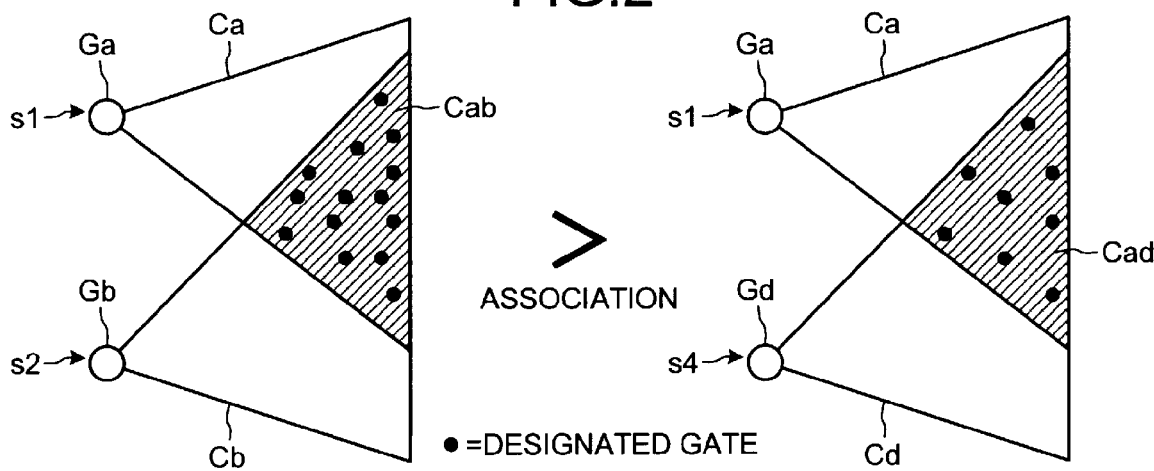
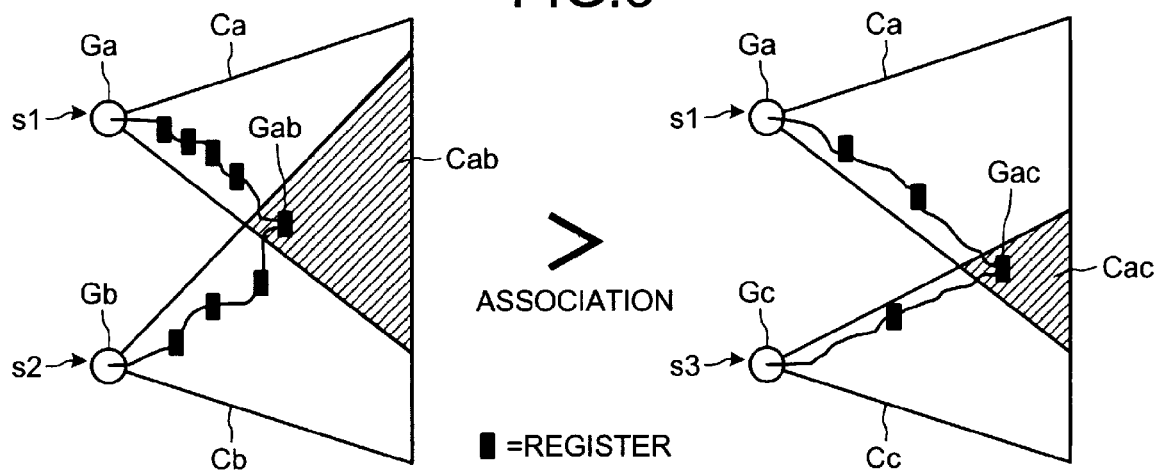

|  | | EXISTENCE OF RELATION BETWEEN INPUT GATES MAKING UP SPECIFICATION-BASED COMBINATIONS | | |
|---|---|---|---|---|
|  | | YES | | NO |
|  | | STRONG | WEAK | |
| EXISTENCE OF RELATION BETWEEN INPUT GATES MAKING UP IMPLEMENTATION-BASED COMBINATIONS | STRONG (YES) | OK | WARNING | WARNING (REMARK) |
| | WEAK (YES) | WARNING | OK | WARNING (REMARK) |
| | NO | WARNING (IMPLEMENTATION CHECK REQUIRED) | WARNING (IMPLEMENTATION CHECK REQUIRED) | OK |

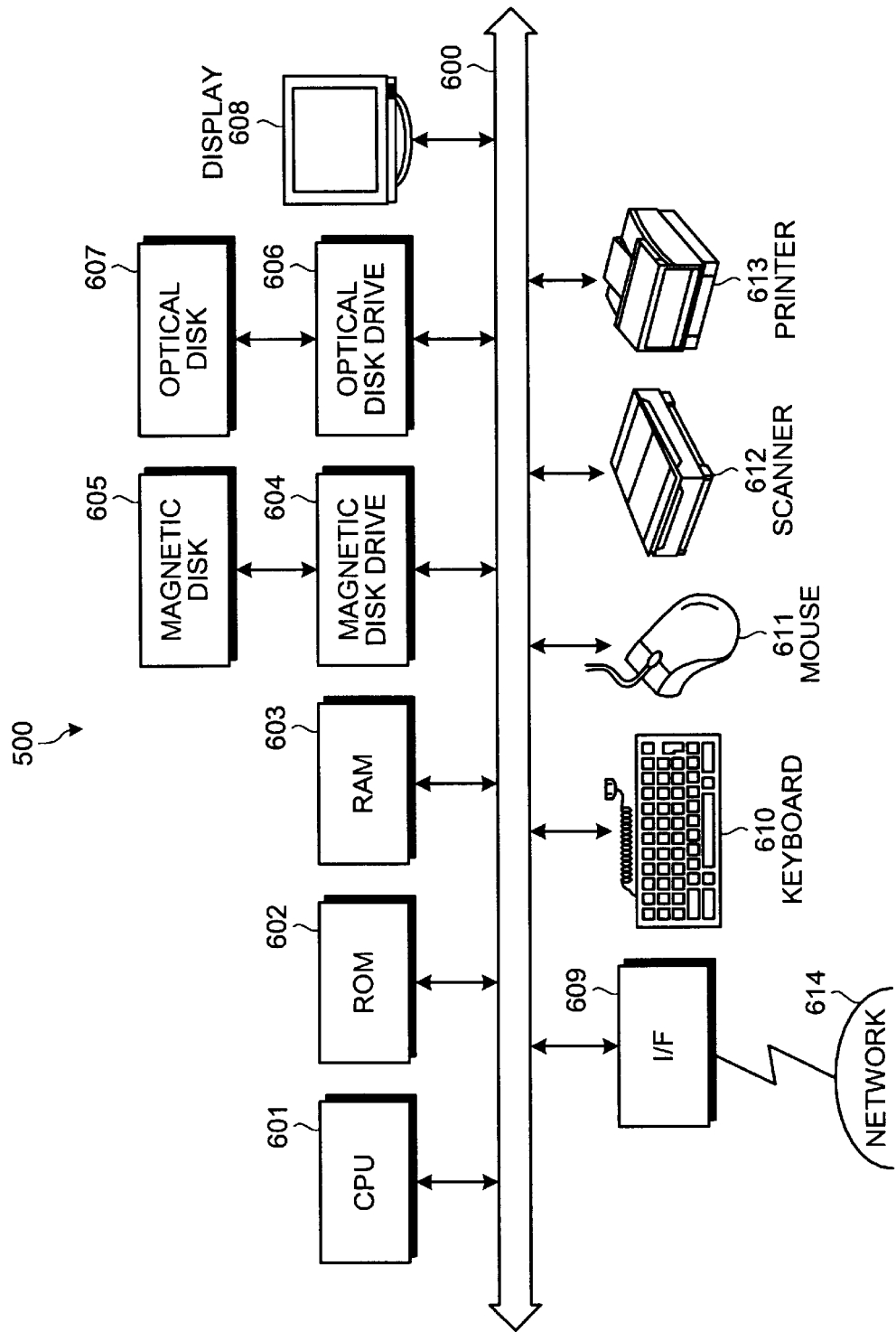

FIG.7

```
module example
  ( clk, G0, G1, G2, G3, G7, G16,
G18 );
    input clk /* CLOCK SIGNAL*/;
  input G0, G1, G2, G3 ;
  output G7, G16, G18 ;

wire w4, w5, w8, w9, w10, w11,
w12,
      w13, w14, w15, w17 ;
  G4 g4 ( G1, w4 );
  G5 g5 ( G0, G1, w5 );
  FF g6 ( clk, w5, G7 );
  FF g8 ( clk, w4, G2, w8 );
  G9 g9 ( G3, w9 );
  G10 g10 ( G2, w9, w10 );
  FF g11 ( clk, w10, w11 );
  G12 g12 ( w8, w11, w12 );
  G13 g13 ( w12, w13 );
  G14 g14 ( w13, w9, w14 );
  FF g15 ( clk, w13, G16 );
  FF g17 ( clk, w14, G18 );
endmodule
```

```
module FF ( clk, d, q );
  input clk, d;
  output q;
  always @(posedge clk) q <= d;
endmodule module G4 ( x, y );
  input x;
  output y;
  assign y = ~x;
endmodule module G5 ( x, y, z );
  input x, y;
  output z;
  assign z = x & y;
endmodule

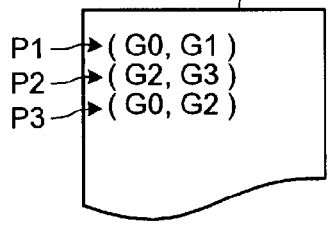

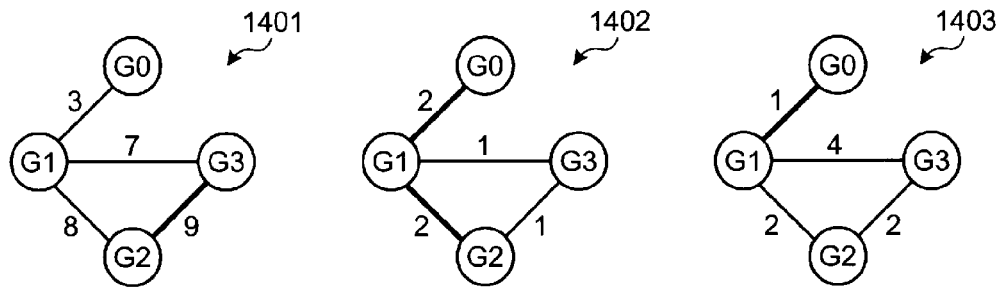

STRENGTH OF RELATION
STRONG: ━━━
WEAK: ───
NO ASSOCIATION: NO LINE

FIG.15

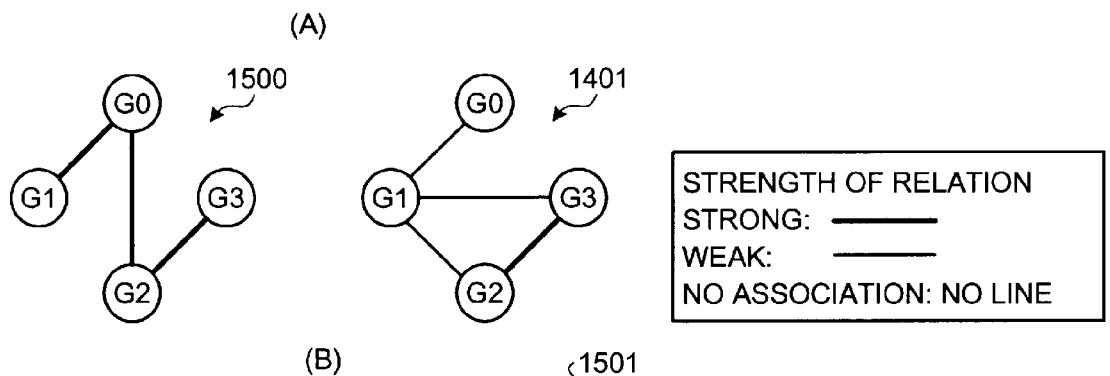

(A)

STRENGTH OF RELATION
STRONG: ━━━
WEAK: ───
NO ASSOCIATION: NO LINE (B) 1501

SPECIFICATION-BASED RELATION AND IMPLEMENTATION-BASED RELATION COINCIDE.
[SPECIFICATION-BASED RELATION:IMPLEMENTATION-BASED RELATION]=
 [STRONG: STRONG]: (G2, G3)
 [NO ASSOCIATION: NO ASSOCIATION]: (G0, G3)
WARNING: COMBINATION FOR WHICH SPECIFICATION-BASED RELATION AND IMPLEMENTATION-BASED RELATION DIFFER HAS BEEN DETECTED.
[SPECIFICATION-BASED RELATION:IMPLEMENTATION-BASED RELATION]=
 [STRONG: WEAK]: (G2, G3)
 [STRONG: NO ASSOCIATION]: (G0, G2)
 [NO ASSOCIATION: WEAK]: (G1, G3), (G1, G2)

FIG.16

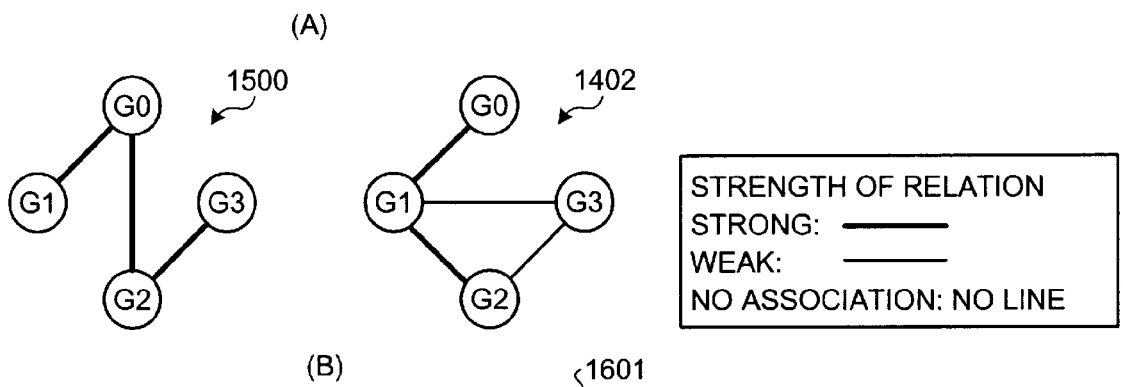

(A)

(B)

1601

SPECIFICATION-BASED RELATION AND IMPLEMENTATION-BASED RELATION COINCIDE.
[SPECIFICATION-BASED RELATION:IMPLEMENTATION-BASED RELATION]=
 [STRONG: STRONG]: (G0, G1)
 [NO ASSOCIATION: NO ASSOCIATION]: (G0, G3)
WARNING: COMBINATION FOR WHICH SPECIFICATION-BASED RELATION AND IMPLEMENTATION-BASED RELATION DIFFER HAS BEEN DETECTED.
[SPECIFICATION-BASED RELATION:IMPLEMENTATION-BASED RELATION]=
 [STRONG: WEAK]: (G2, G3)         [STRONG: NO ASSOCIATION]: (G0, G2)
 [NO ASSOCIATION: STRONG]: (G1, G2)  [NO ASSOCIATION: WEAK]: (G1, G3)

VERIFICATION SUPPORT APPARATUS, VERIFICATION SUPPORT METHOD, AND COMPUTER PRODUCT

CROSS REFERENCE TO RELATED APPLICATIONS

This application is based upon and claims the benefit of priority from the prior Japanese Patent Application No. 2008-120577, filed on May 2, 2008, the entire contents of which are incorporated herein by reference.

FIELD

The embodiment discussed herein is related to support of logic verification of hardware.

BACKGROUND

In logic verification of a hardware design, test patterns are prepared by changing combinations of values assigned to parameters as input to be verified. Conventionally, combinations of values to be tested are changed depending on the existence or absence of a relation between parameters. In general, parameters related to each other are tested in more combinations as compared to parameters not related with each other. In addition, related parameters are extracted from a specification for each function, a strength of the relation between the parameters is determined from the behavior of the function (such as an algorithm), and combinations are changed based on the determined strength of the relation.

Various logic verification tools have been conventionally disclosed for preparation of test patterns, such as a method by which correlation between primary input is provided as a constraint condition and an input pattern is prepared so as to satisfy the condition, and a method by which validity of a simulation result is determined (for example, refer to Japanese Laid-Open Patent Application Publication Nos. H07-35828 and H07-49887).

However, such conventional logic verification has a drawback in that a boundary condition of a parameter differs between the specification and implementation. In addition, conventional logic verification may falsely indicate parameters with no relation in a specification to have a relation in implementation, and conversely, may indicate parameters with a relation in the specification to have no relation in implementation. Further, conventional logic verification has a huge problem in that a specification and implementation differ in a sequence of calculation (e.g. sharing of an operator, or changing of a sequence) due to temporal and areal constraints on the implementation, thereby increasing the possibility of missing points to be tested.

Conventionally, these failures are overlooked, and thus combinations of values assigned to parameters as input to be verified, are not sufficiently selected, and validity of the combinations themselves are not clear. Accordingly, it is not possible to perform logic verification completely covering signal changes in verification targets and the performance of functions realized by the verification targets, leading to decreased reliability of the logic verification.

SUMMARY

According to an aspect of an embodiment, a computer-readable recording medium stores therein a verification support program that causes a computer to execute: acquiring an implementation description of a verification target; identifying, based on the implementation description, a combination of input gates of the verification target, the input gates each receiving an input signal; detecting a pair of output cones for the combination of input gates identified at the identifying, each of the output cones including gates that are of the verification target and to which input signals from the input gates making up the combination reach; detecting, for the combination of input gates, a common output cone that includes gates common to the pair of output cones detected at the detecting the pair of output cones; calculating, based on the common output cone detected at the detecting the common output cone, a degree of relation between the input gates making up the combination; determining, for the combination of input gates, a strength of relation according to a calculation result at the calculating; setting a strength of relation for a combination of the input gates, the combination being based on a specification of the verification target and corresponding to the combination identified at the identifying; judging whether the strength of relation set at the setting and the strength of relation determined at the determining coincide; and outputting a result of the judging.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram for explaining a first estimation of relation in implementation;

FIG. 2 is a diagram for explaining a second estimation of relation in the implementation;

FIG. 3 is a diagram for explaining a third estimation of relation in the implementation;

FIG. 6 is a block diagram of the verification support apparatus according to the embodiment;

FIG. 7 is a diagram depicting a description example of an implementation description of a verification target depicted in FIG. 5;

FIG. 8 is a diagram depicting a description example of a parameter file depicted in FIG. 5;

FIG. 14 is a diagram for explaining a result of determination on the strength of relation;

FIGS. 15 and 16 are diagrams for explaining judgment of coincidence of the strengths of relation for the combinations.

DESCRIPTION OF EMBODIMENT(S)

Figures 4, 5:
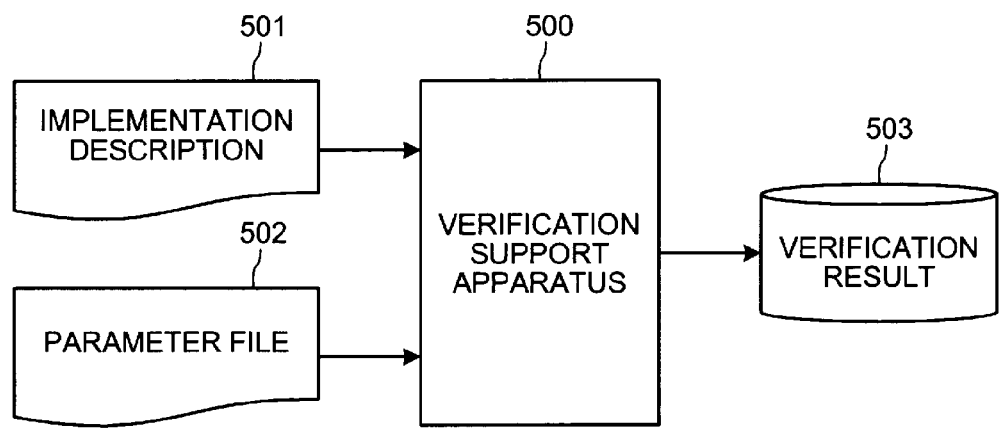
FIG. 4 is a diagram for explaining a check on consistency between relation in the specification and relation in the implementation.
FIG. 5 is a diagram depicting a general configuration of a verification support apparatus of the embodiment.

Preferred embodiments of the present invention will be explained with reference to the accompanying drawings. Herein, parameters refer to, for example, input gates to which an input signal is applied (e.g., input terminals, primary input).

In the embodiment, the following tasks are performed: (1) estimating relation in implementation between input gates that make up a combination of input gates in the implementation; and (2) checking consistency between relation in the specification and the relation in the implementation estimated at (1).

First, (1) estimating relation in the implementation will be explained below. Among combinations of input gates to which an input signal is provided, the signal is traced from each input gate in a direction toward an output gate (primary output), and partial circuits, e.g., the gates between the input gate and the output gate, are detected. The partial circuits are called output cones. In addition, a group of gates common to a pair of output cones is called common output cone. Relation between input gates making up a combination of input gates is estimated from the size of a common output cone.

FIG. 1 is a diagram for explaining a first estimation of relation in the implementation. The left side of FIG. 1 depicts the relation between input gates Ga and Gb in the implementation. An input signal s1 is applied to the input gate Ga. The input signal s1 is transmitted from the input gate Ga in a direction toward an output gate and reaches the output gate; thereby an output cone Ca is obtained. Similarly, an input signal s2 is applied to the input gate Gb. The input signal s2 is transmitted from the input gate Gb in a direction toward an output gate and reaches the output gate; thereby an output cone Cb is obtained. A common output cone Cab (hatched area Cab in FIG. 1) is an area where the output cones Ca and Cb share gates.

The right side of FIG. 1 depicts a relation in the implementation between the input gates Ga and Gc. The input signal s1 is applied to the input gate Ga. The input signal s1 is transmitted from the input gate Ga in a direction toward an output gate and reaches the output gate; thereby the output cone Ca is obtained. Similarly, an input signal s3 is applied to the input gate Gc. The input signal s3 is transmitted from the input gate Gc in a direction toward an output gate and reaches the output gate; thereby an output cone Cc is obtained. A common output cone Cac (hatched area Cac in FIG. 1) is an area where the output cones Ca and Cc share gates.

In FIG. 1, the number of gates in the common output cones Cab and Cac are expressed respectively by the size of the cone areas. Therefore, the combination of the input gates (Ga and Gb) deriving the common output cone Cab is stronger in relation than the combination of the input gates (Ga and Gc) deriving the common output cone Cac.

FIG. 2 is a diagram for explaining a second estimation of relation in the implementation. As depicted at the right side of FIG. 2, an input signal s4 is applied to an input gate Gd. The input signal s4 is transmitted from the input gate Gd in a direction toward an output gate and reaches the output gate; thereby an output cone Cd is obtained. A common output cone Cad (hatched area Cad in FIG. 2) is an area where the output cones Ca and Cd share gates. In FIG. 2, gates capable of making up the common output cones Cab and Cad are basically limited to designated gates. The designated gates may be memory elements such as registers, finite-state machines, or user-designated gates irrespective of gate type. In FIG. 2, the designated gates are indicated by black points.

In FIG. 2, the number of gates in the common output cones Cab and Cad are also expressed by the size of the cone areas. The common output cone Cad includes more gates than the common output cone Cab, but the common output cone Cab includes more designated gates than the common output cone Cad. Accordingly, the combination of the input gates (Ga and Gb) deriving the common output cone Cab is stronger in relation than the combination of the input gates (Ga and Gd) deriving the common output cone Cad.

FIG. 3 is a diagram for explaining a third estimation of relation in the implementation. As depicted in FIG. 3, the relation is estimated by the number of gates from an input gate to a gate at the head of a common output cone. As depicted at the left side of the diagram, the numbers of gate reached by the input signals s1 and s2 from the input gates Ga and Gb to a gate Gab at the head of the common output cone Cab are 5 and 4, respectively. Among the two values, the larger number of gate between the input gate Ga and the gate Gab; hence, here, 5, will be adopted.

Similarly as depicted at the right side of the diagram, the numbers of gate stages reached by the input signals s1 and s3 from the input gates Ga and Gc to a gate Gac at the head of the common output cone Cac are 3 and 2, respectively. Among the two values, the larger number of the gates between the input gate Ga and the gate Gac, that is 3, will be employed. The smaller the number of gates, the stronger relation becomes. In FIG. 3, the combination of the input gates (Ga, Gc) deriving the common output cone Cac is stronger in relation than the combination of the input gates (Ga, Gb) deriving the common output cone Cab.

Next, (2) checking consistency between relation in the specification and in the implementation will be explained below. In checking consistency, for the same combinations of input gates, the relations for combinations of input gates determined based on the specification are compared with the relations for the combinations of input gates determined based on the implementation.

FIG. 4 is a diagram for explaining a check on consistency between relation in the specification and relation in the implementation. In FIG. 4, the strength of a relation is classified into three patterns: "strong", "weak", and "no relation". The strength of relation for the combinations of input gates determined from the specification is selected from among the three patterns "strong", "weak", and "no relation". The pattern is user-selectable according to the contents of the specification.

In FIG. 4, if the strength of relation is the same between the specification and the implementation, it is understood that there is consistency between the specification and the implementation. In addition, if the relation is "strong" in either the specification or the implementation and "weak" in the other, a warning is issued due to the inconsistency between the two. If the relation is "strong" or "weak" in the specification and "no relation" in the implementation, a warning is issued due to a possibility of a deficiency in the implementation. Meanwhile, if the strength of the relation in the implementation is "strong" or "weak" and there is "no relation" in the specification, a warning is given as a guide to indicate that there is a possibility that a relation may be indicated in the implementation even though the relation is not described in the specification.

FIG. 5 is a diagram depicting a general configuration of a verification support apparatus of the embodiment. As described above, a verification support apparatus 500 executes: (1) estimating, in the implementation, relations between input gates making up a combination of input gates in the implementation; and (2) checking consistency between relations in the specification and relations in the implementation estimated at (1). Accordingly, an implementation description 501 of a verification target and a parameter file 502 describing combinations of input gates based on the specification of the verification target, are input. Then, the processes depicted in FIGS. 1 to 4 are performed, and a comparative result such as that depicted in FIG. 4 is output as a verification result 503.

FIG. 6 is a block diagram of the verification support apparatus according to the embodiment. As depicted in FIG. 6, the verification support apparatus 500 includes a central processing unit (CPU) 601, a read-only memory (ROM) 602, a random access memory (RAM) 603, a magnetic disc drive 604, a magnetic disc 605, a optical disc drive 606, an optical disc 607, a display 608, an interface (I/F) 609, a keyboard 610, a mouse 611, a scanner 612, and a printer 613, connected to one another by way of a bus 600.

The CPU 601 governs overall control of the verification support apparatus 500. The ROM 602 stores therein programs such as a boot program. The RAM 603 is used as a work area of the CPU 601. The magnetic disc drive 604, under the control of the CPU 601, controls reading/writing of data from/to the magnetic disc 605. The magnetic disc 605 stores therein the data written under control of the magnetic disc drive 604.

The optical disc drive 606, under the control of the CPU 601, controls reading/writing of data from/to the optical disc 607. The optical disc 607 stores therein the data written under control of the optical disc drive 606, the data being read by a computer.

The I/F 609 is connected to a network 614 such as a local area network (LAN), a wide area network (WAN), and the Internet through a communication line and is connected to other apparatuses through the network 614. The I/F 609 administers an internal interface with the network 614 and controls the input/output of data from/to external apparatuses. For example, a modem or a LAN adaptor may be employed as the I/F 609.

The keyboard 610 is equipped with keys for the input of characters, numerals, and various instructions, and data is entered through the keyboard 610. The keyboard 610 may be a touch-panel input pad or a numeric key keypad. The mouse 611 performs cursor movement, range selection, and movement, size change, etc., of a window. The mouse 611 may be a trackball or a joystick provided it has similar functions as a pointing device.

The scanner 612 optically reads an image and takes in the image data into the computer apparatus. The scanner 612 may have an optical character recognition (OCR) function as well. The printer 613 prints image data and document data. The printer 613 may be, for example, a laser printer or an ink jet printer.

FIG. 7 is a diagram depicting a description example of the implementation description 501 of the verification target depicted in FIG. 5. This implementation description is written in Verilog-Hardware Description Language (HDL). In FIG. 7, reference numerals G0 to G18 denote gates. Specifically, G0 to G3 denote input gates and G7, G16, and G18 denote output gates. Reference numerals w4, w5, and w8 to w14 denote data lines between gates.

FIG. 8 is a diagram depicting a description example of the parameter file 502 depicted in FIG. 5. The parameter file 502 describes parameter sets P1 to P3 as combinations of input gates based on the specification of the verification target, where the parameter set P1 is a combination of input gates G0, G1 based on the specification; the parameter set P2 is a combination of input gates G2, G3 based on the specification; and the parameter set P3 is a combination of input gates G0, G2 based on the specification.

Figure 9:
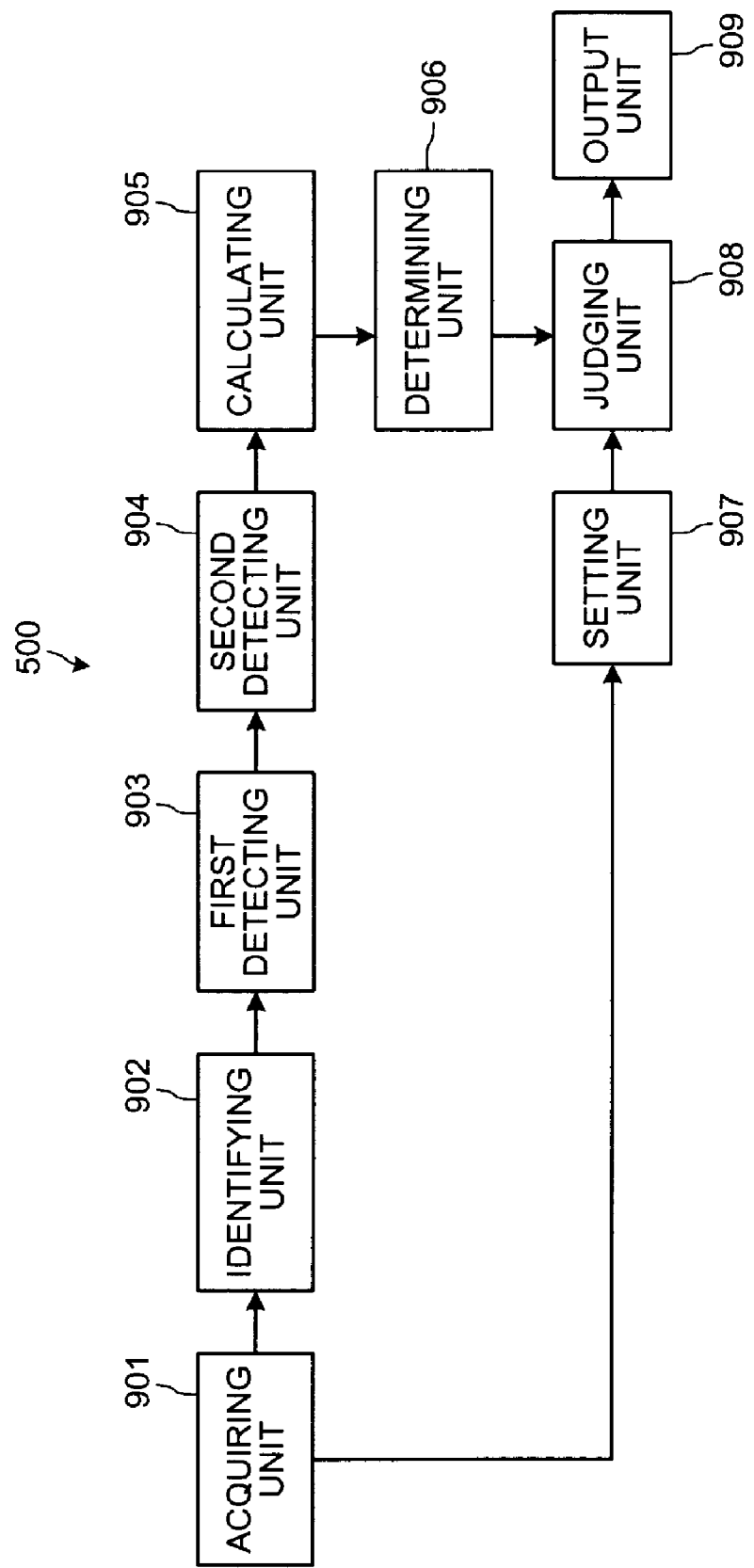
FIG. 9 is a block diagram of a functional configuration of the verification support apparatus.

FIG. 9 is a block diagram of a functional configuration of the verification support apparatus 500. The verification support apparatus 500 includes an acquiring unit 901, an identifying unit 902, a first detecting unit 903, a second detecting unit 904, a calculating unit 905, a determining unit 906, a setting unit 907, a judging unit 908, and an output unit 909. Specifically, these controlling functions (the acquiring unit 901 to the output unit 909) are realized by causing the CPU 601 to execute programs stored in a storage area such as the ROM 602, the RAM 603, the magnetic disk 605, or the optical disk 607, or by using the I/F 609, for example.

The acquiring unit 901 has a function of acquiring the implementation description 501 and parameter file 502 of the verification target. Specifically, the acquiring unit 901 reads the implementation description stored in a storage area such as the RAM 603, the magnetic disk 605, or the optical disk 607, and receives the implementation description 501 from an external source, for example.

Figure 10:
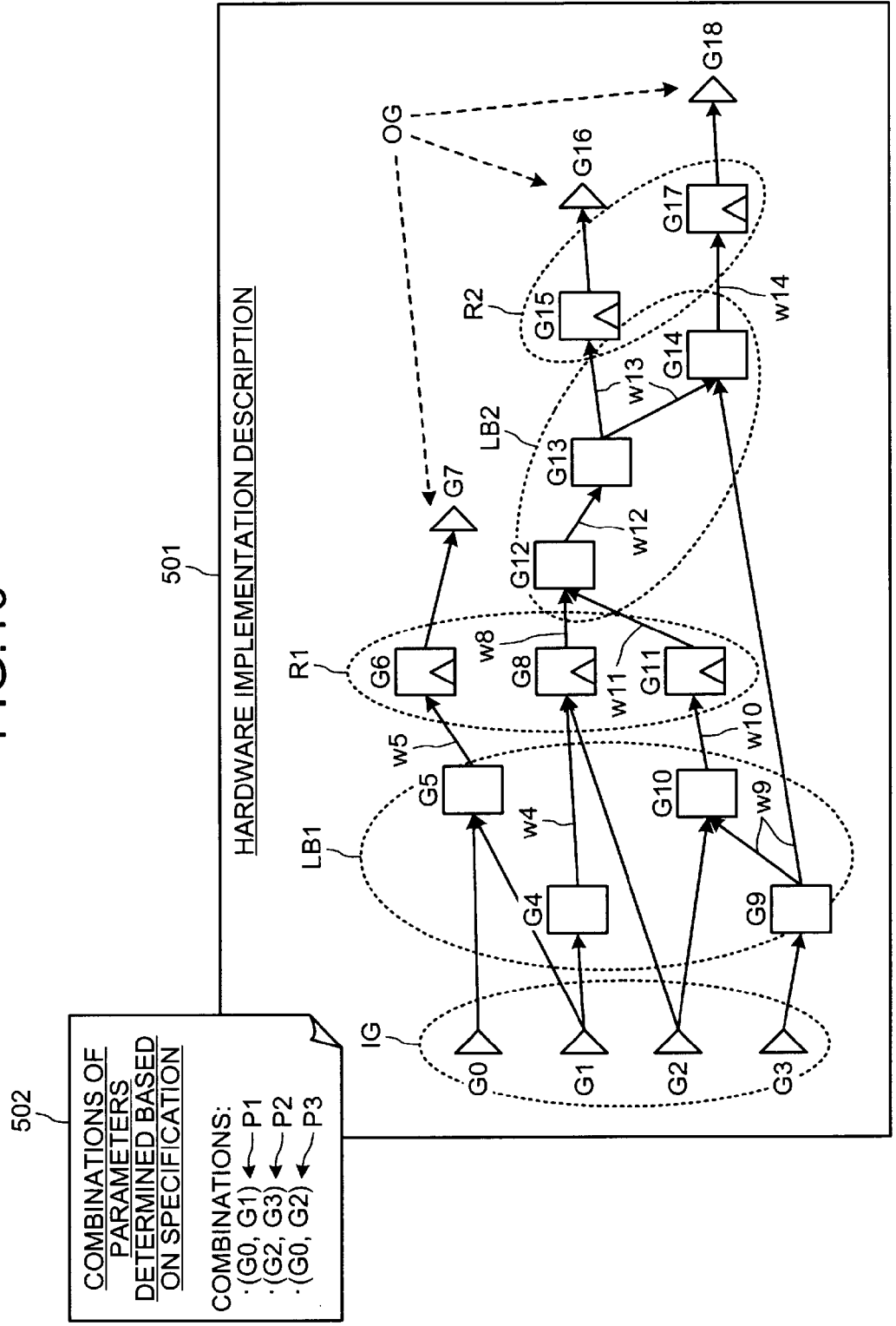
FIG. 10 is a diagram depicting an example of acquisition of the implementation description and parameter file.

FIG. 10 is a diagram depicting an example of acquisition of the implementation description 501 and parameter file 502. In FIG. 10, the gates G0 to G3 make up an input gate group IG. The gates G4, G5, G9, and G10 make up a first logic operation block LB1. The gates G6, G8, and G11 make up a first memory element (register) group R1. The gates G12 to G14 make up a second logic operation block LB2. The gates G15 and G17 make up a second memory element (register) group R2. The gates G7, G16, and G18 make up an output gate group OG.

The identifying unit 902 has a function of identifying, based on the implementation description 501 acquired by the acquiring unit 901, combinations of input gates of the verification target into which input signals are input. Specifically, for example, the identifying unit 902 identifies combinations of input gates from "G0, G1, G2, G3" described in an "input" line of the implementation description 501. In this example, identified combinations include (G0, G1), (G0, G2), (G0, G3), (G0, G2), (G0, G3), and (G2, G3). These identified combinations (G0, G1) to (G2, G3) are stored in a storage area such as the RAM 603, the magnetic disk 605, or the optical disk 607.

The first detecting unit 903 has a function of detecting a pair of output cones that respectively include gates, which are of the verification target and to which an input signal reaches, the input signal being from each of the input gates making up a combination identified by the identifying unit 902. Specifically, in the example depicted in FIGS. 1 to 3, the first detecting unit 902 detects output cones Ca to Cd for the input gates Ga to Gd. More specifically, the first detecting unit 903 reads the combinations of input gates (G0, G1) to (G2, G3), and selects one of these combinations. Then, the first detecting unit 903, from the input gates making up the selected combination and in a direction toward an output gate, searches for a gate as an output destination to thereby identify output cones.

In the example depicted in FIG. 10, an output destination of the input gate G0 can be traced in a sequence of G0→G5→G6→G7. Accordingly, the gates {G5, G6, G7} make up an output cone of the input gate G0. Similarly, detected paths for the input gate G1 are: G1→G5→G6→G7; G1→G4→G8→G12→G13→G15→G16; and G1→G4→G8→G12→G13→G14→G17→G18. Accordingly, the gates {G4, G5, G6, G7, G8, G12, G13, G14, G15, G16, G17, G18} make up an output cone of the input gate G1. The detected output cones are stored in a storage area such as the RAM 603, the magnetic disk 605, or the optical disk 607.

Depicted in FIG. 9, the second detecting unit 904 has a function of detecting, for each of the combinations of input gates, a common output cone that includes gates common to the pair of output cones detected by the first detecting unit 903. Specifically, in the example depicted in FIGS. 1 to 3, the second detecting unit 904 detects the common output cone Cab from the output cones Ca and Cb, detects the common output cone Cac from the output cones Ca and Cc, and detects the common output cone Cad from the output cones Ca and Cd.

More specifically, the second detecting unit 904 reads a pair of output cones corresponding to the combination of input gates stored in a storage area such as the RAM 603, the magnetic disk 605, or the optical disk 607. In the foregoing example, the second detecting unit 904 reads the output cone of the input gate G0 and the output cone of the input gate G1, and then performs an AND operation with respect to the two output cones to obtain a common output cone. The common output cone here includes the gates {G5, G6, G7}. The detected common output cones are stored in a storage area such as the RAM 603, the magnetic disk 605, or the optical disk 607.

The calculating unit 905 has a function of calculating, based on the common output cone detected by the second detecting unit 904 and for each of the combinations of the input gates, a degree of relation between the input gates making up a combination. Specifically, for example, the degree of relation is obtained by counting the number of gates in the common output cone as depicted in FIG. 1. Alternatively, the degree of relation may be obtained by counting the number of storage elements such as registers, finite-state machines, or other specific gates designated by the user, such as depicted in FIG. 2.

At present, hardware is described at a level of abstraction generally called as register transfer level (RTL) (which is higher than gate levels such as an AND gate and an OR gate (or net list level)). An RTL description is converted to a gate level by a logic synthesis tool. The number of gates included in the converted circuit (in particular, the number of logic elements excluding registers (combination logic elements)) may vary greatly depending on (area- or delay-related) constraints imposed on the logic synthesis tool.

However, gates that are registers are limited to gates whose structure is defined in the RTL description. Therefore, the gates to be converted into registers in the RTL description are easily identified and are less affected by the constraints of the logic synthesis. In addition, such gates are frequently used in defining operation of a circuit in the specification. If logic synthesis is performed under uniform constraints, the complexity of logic in the original RTL description correlates with the number of gates resulting from the synthesis (the number of gates becomes larger with increasing complexity of the logic). Therefore, in simple terms, the degree of relation is indicated by the number of gates included in the common output cone.

Meanwhile, if any partial circuit synthesized under substantially different constraints is included, calculating the degree of relation with a focus on registers corresponding to the gates in the RTL description, rather than simply comparing the numbers of gates, expresses a more practical degree of relation.

Alternatively, as depicted in FIG. 3, the degree of relation may be determined by counting the number of gates from the two input gates to a gate at the head (the most upstream gate) of the common output cone. The lower the number of gates from the input gate to the gate at the head of the common output cone is, the more prone the degree of relation is to being affected by the two input gates, and therefore the degree of relation between the two input gates becomes stronger. That is, the lower the degree of relation is, the stronger the degree of relation is. A method of calculating the degree of relation will be explained in detail below.

Figure 11A:
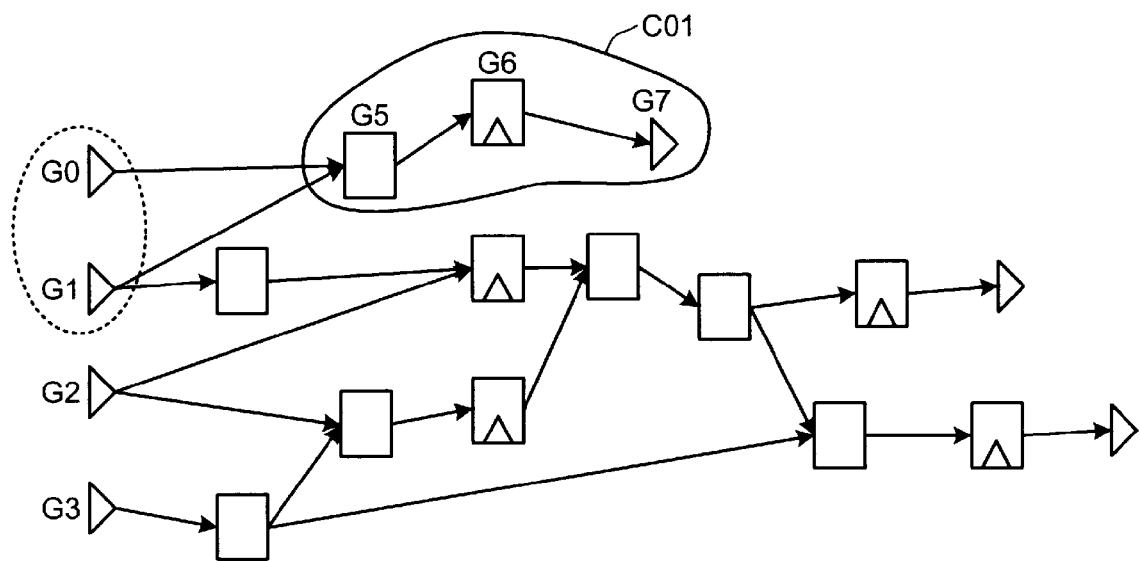
FIGS. 11A to 11F depict calculation of the degree of relation from the number of gates in a common output cone.

FIGS. 11A to 11F are diagrams for explaining a first method of calculating the degree of relation between input gates. FIGS. 11A to 11F depict calculation of the degree of relation from the number of gates in a common output cone. As depicted in FIG. 11A, the degree of relation between the input gates G0 and G1 is determined. The gates G5 to G7 are in a common output cone C01, and therefore the degree of relation is "2".

Figure 11B:
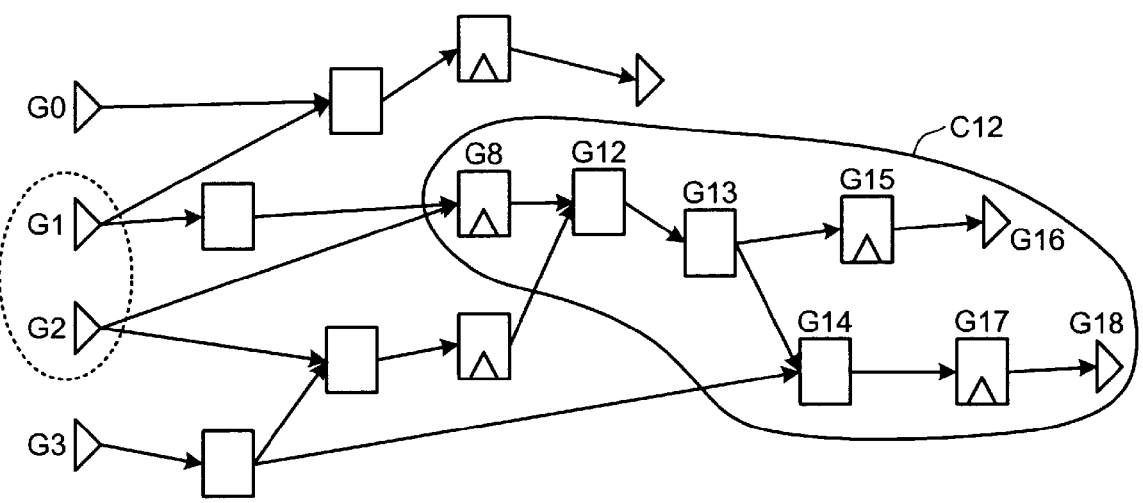
Figure 11C:
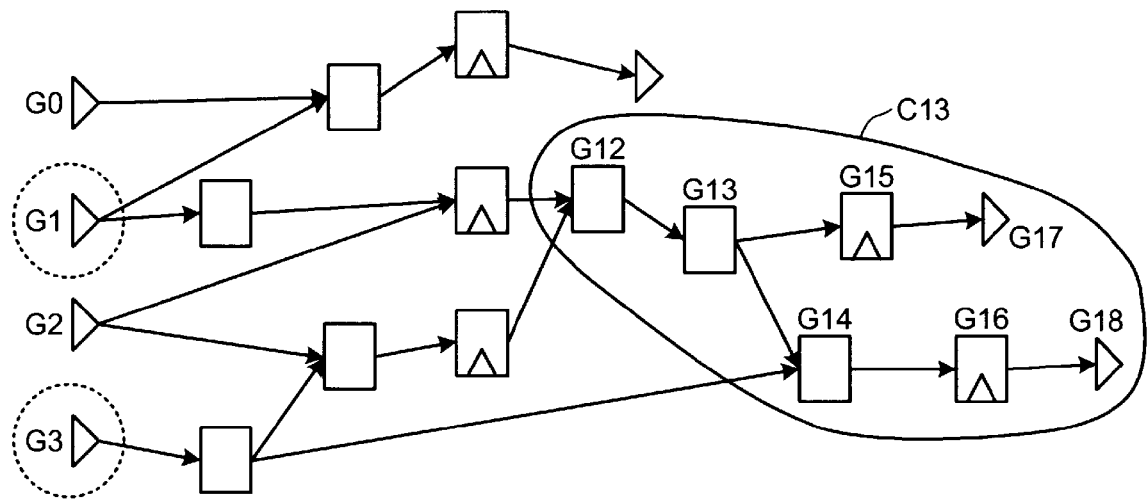
Figure 11D:
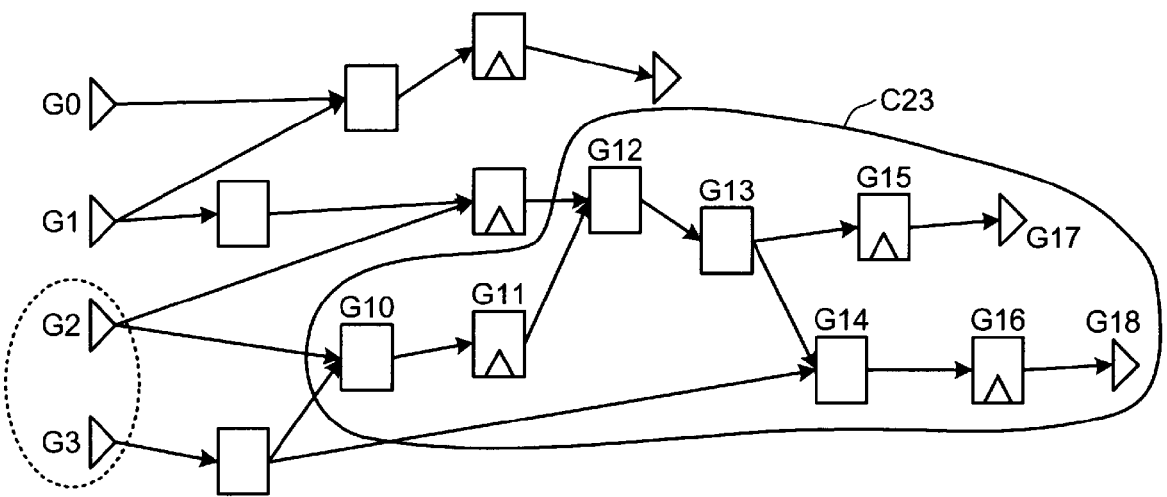

As depicted in FIG. 11B, the degree of relation between the input gates G1 and G2 is determined. The gates G8, G12 to G18 are in a common output cone C12, and therefore the degree of relation is "8". As depicted in FIG. 11C, the degree of relation between the input gates G1 and G3 is determined. The gates G12 to G18 are in a common output cone C13, and therefore the degree of relation is "7". As depicted in FIG. 11D, the degree of relation between the input gates G2 and G3 is determined. The gates G10 to G18 are in a common output cone C23, and therefore the degree of relation is "9".

Figure 11E:
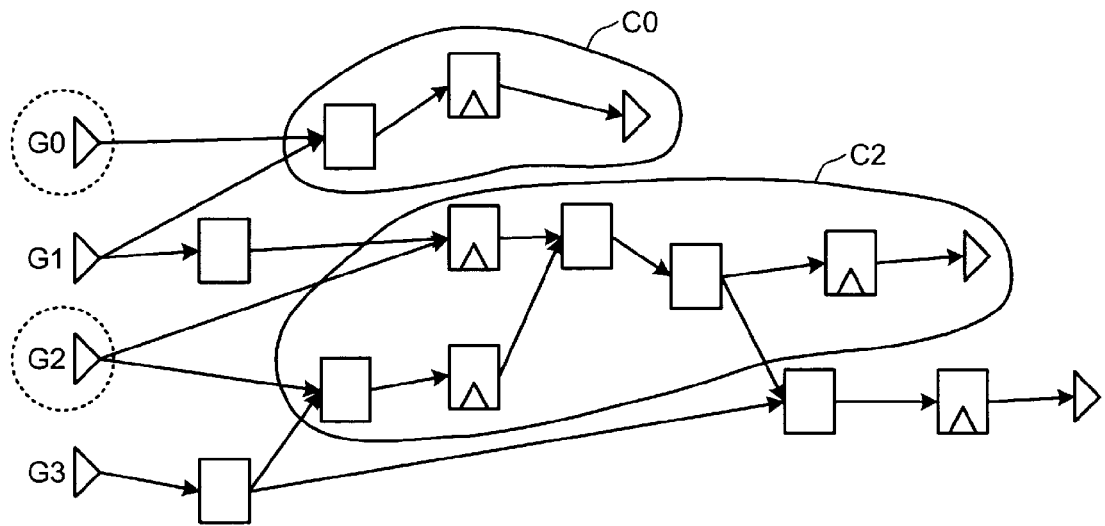
Figure 11F:
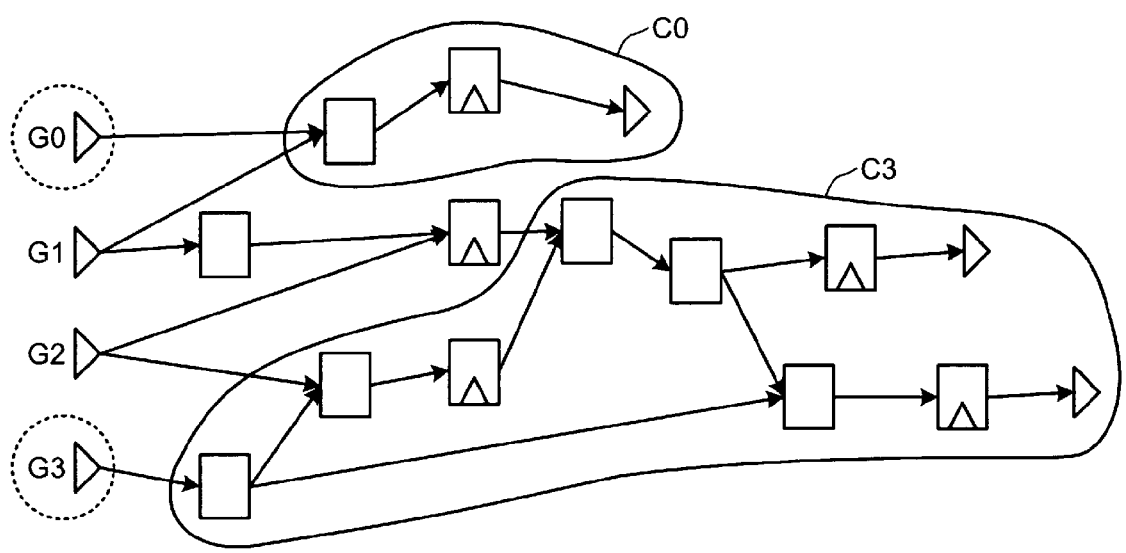

As depicted in FIG. 11E, the degree of relation between the input gates G0 and G2 is determined. Since an output cone C0 corresponding to the input gate G0 does not intersect an output cone C2 corresponding to the input gate G2, there is no common output cone. Therefore, the degree of relation here is "0". As depicted in FIG. 11F, the degree of relation between the input gates G0 and G3 is determined. Since the output cone C0 corresponding to the input gate G0 does not intersect an output cone C3 corresponding to the input gate G3, there is no common output cone. Therefore, the degree of relation here is "0".

Figure 12A:
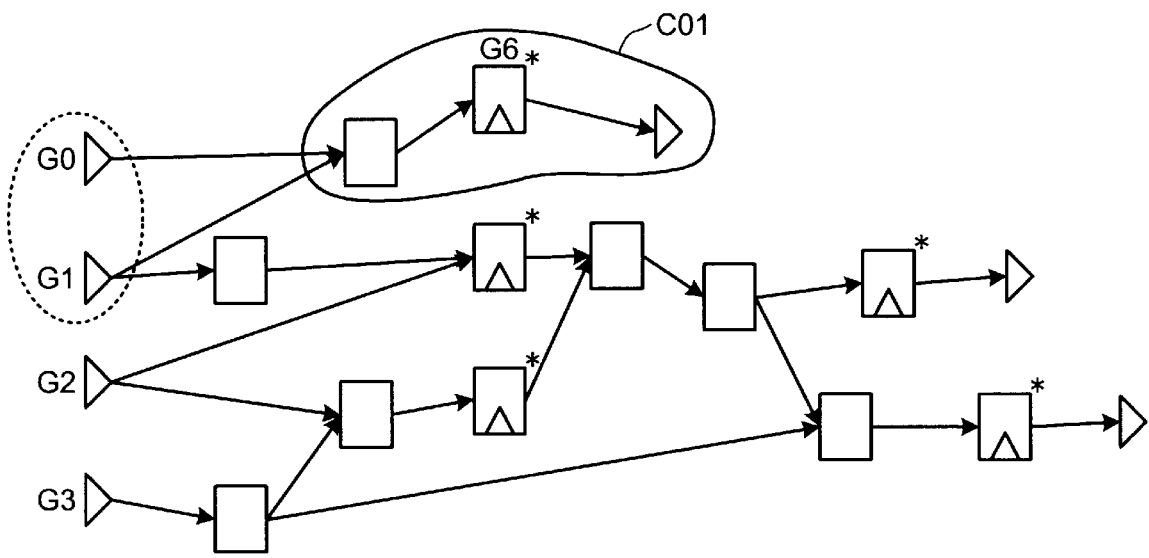
FIGS. 12A to 12F depict calculation of the degree of relation from the number of registers that are designated gates in a common output cone.
Figure 12B:
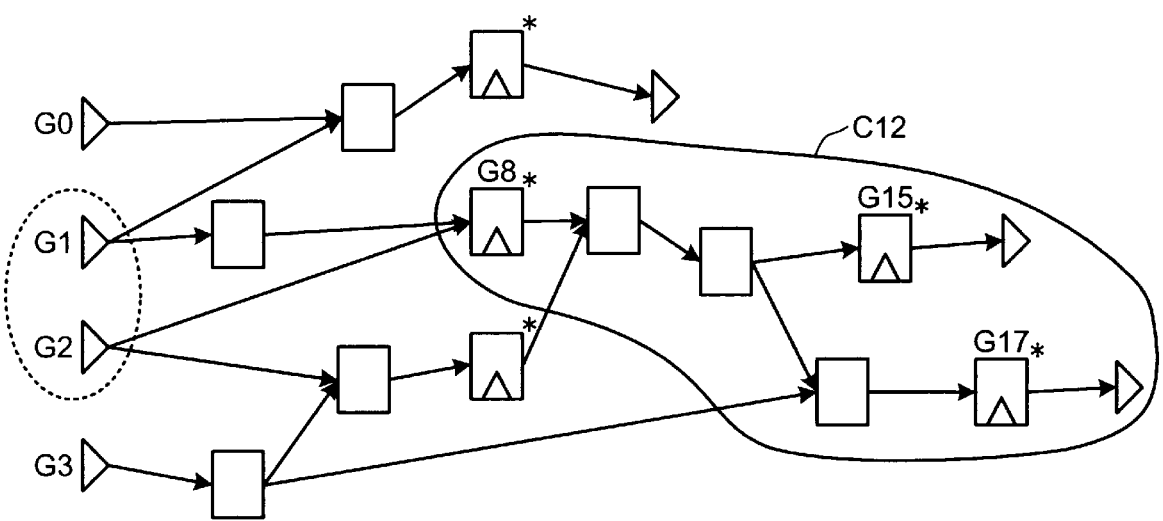

FIGS. 12A to 12F are diagrams for explaining a second method of calculating the degree of relation between input gates. FIGS. 12A to 12F depict calculation of the degree of relation from the number of registers that are designated gates in a common output cone. In FIGS. 12A to 12F, registers (flip-flops) are indicated by an asterisk As depicted in FIG. 12A, the degree of relation between the input gates G0 and G1 is determined. The gate G6 is in the common output cone C01, and therefore the degree of relation is "1". As depicted in FIG. 12B, the degree of relation between the input gates G1 and G2 is determined. The gates G8, G15, and G17 are in the common output cone C12, and therefore the degree of relation is "3".

Figure 12C:
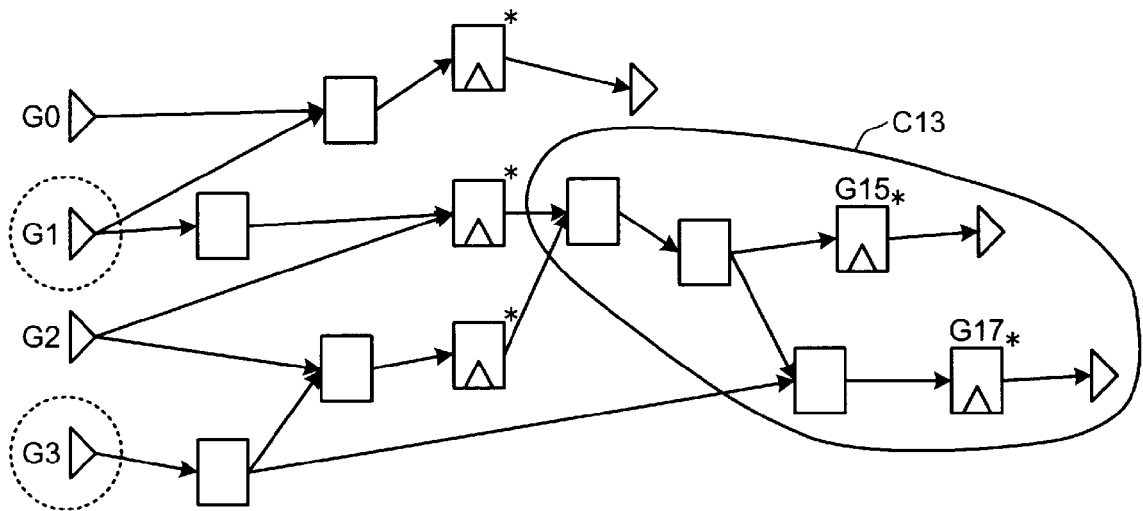
Figure 12D:
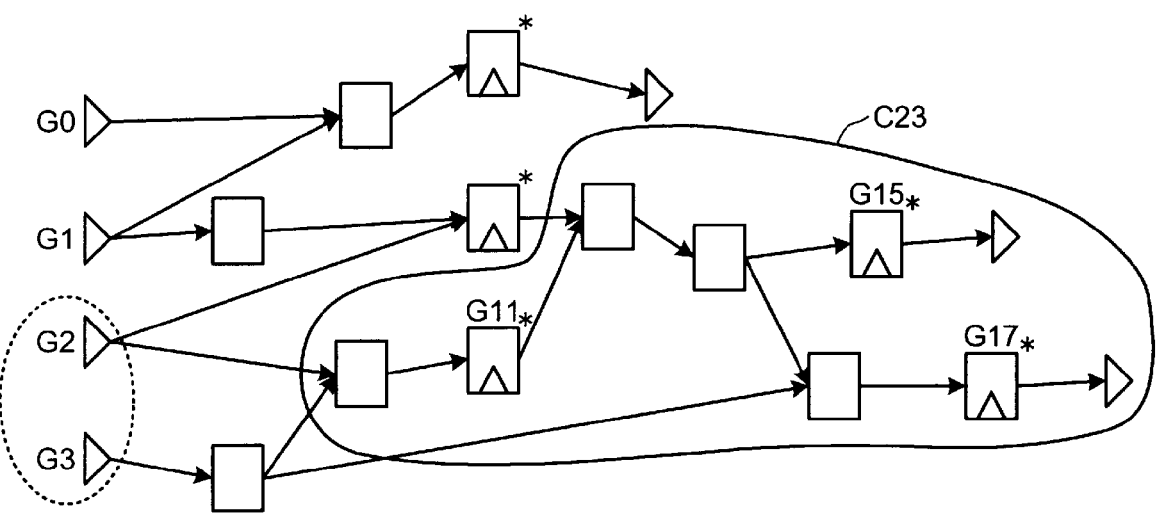

As depicted in FIG. 12C, the degree of relation between the input gates G1 and G3 is determined. The gates G15 and G17 are in the common output cone C13, and therefore the degree of relation is "2". As depicted in FIG. 12D, the degree of relation between the input gates G2 and G3 is determined. The gates G11, G15, and G17 are in the common output cone C23, and therefore the degree of relation is "3".

Figure 12E:
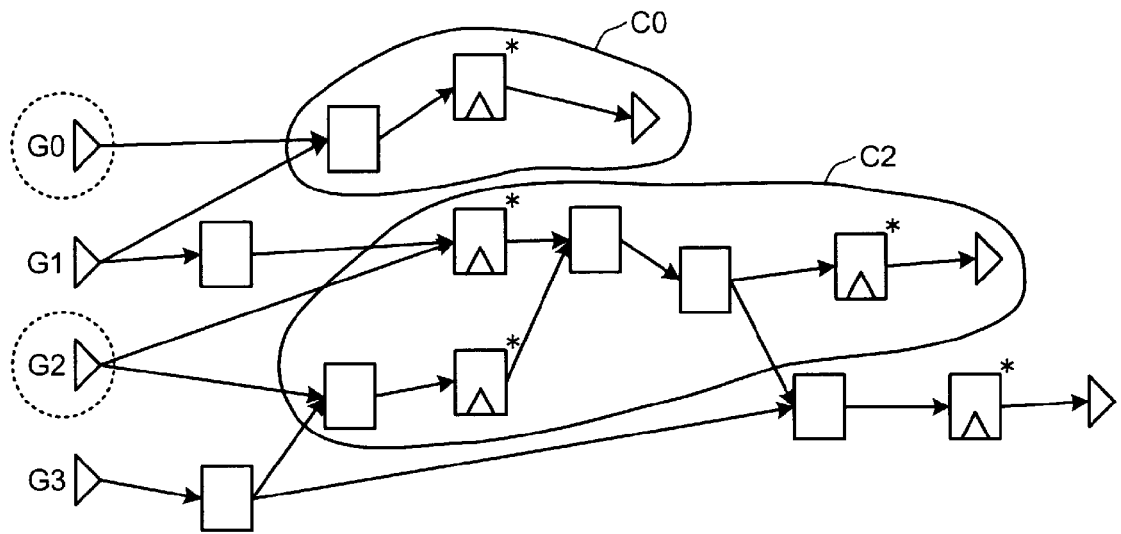

As depicted in FIG. 12E, the degree of relation between the input gates G0 and G2 is determined. Since the output cone C0 corresponding to the input gate G0 does not intersect the output cone C2 corresponding to the input gate G2, there is no common output cone. Therefore, the degree of relation here is "0".

Figure 12F:
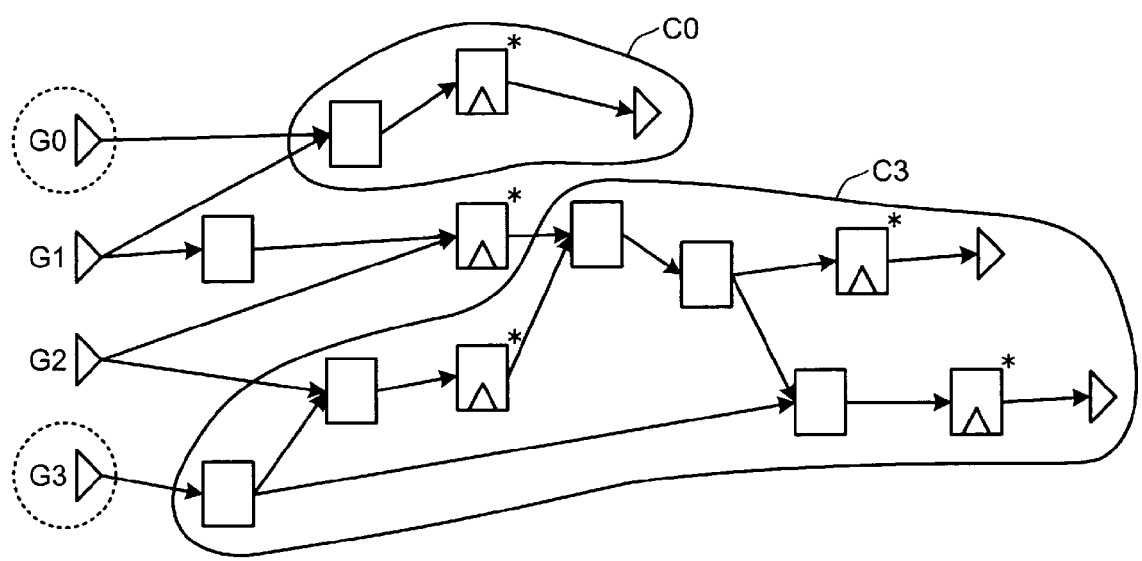

As depicted in FIG. 12F, the degree of relation between the input gates G0 and G3 is determined. Since the output cone C0 corresponding to the input gate G0 does not intersect the output cone C3 corresponding to the input gate G3, there is no common output cone. Therefore, the degree of relation here is "0".

FIGS. 13A to 13F are diagrams for explaining a third method of calculating the degree of relation between input gates. FIGS. 13A to 13F depict calculation of the degree of relation from the number of gates to the gate at the head of the common output cone. In FIGS. 13A to 13F, the input gates to the gates at the head of the common cones are indicated by an asterisk (*). In addition, there are two target input gates and thus the number of gates from each input gate is calculated, and the larger number is adopted.

Figure 13A:
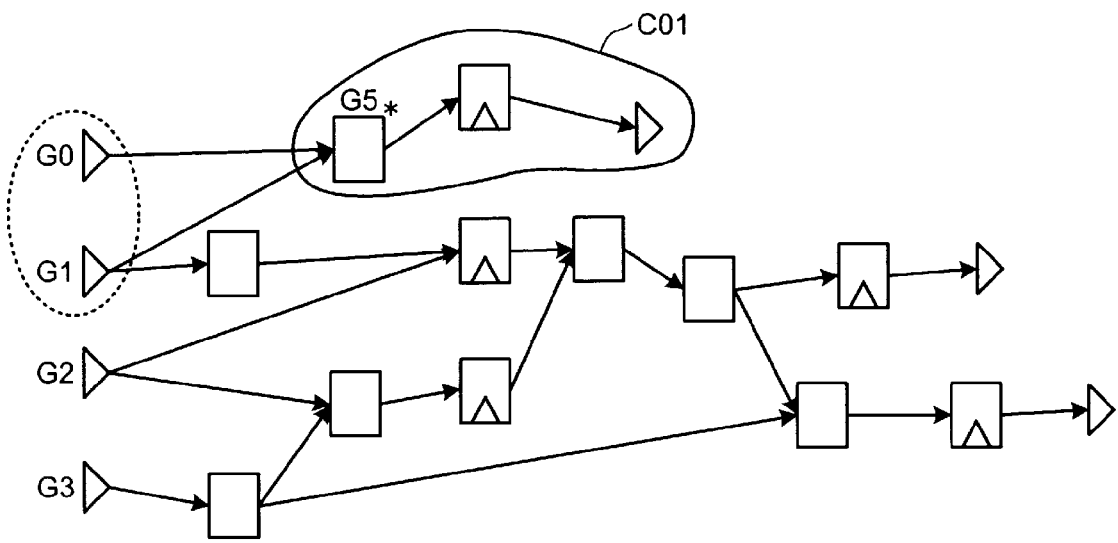
FIGS. 13A to 13F depict calculation of the degree of relation from the number of gates to the gate at the head of a common output cone.

As depicted in FIG. 13A, the degree of relation between the input gates G0 and G1 is determined. Since the gate G5 is at the head of the common output cone C01, the number of gates from the input gate G0 is "1" and the number of gates from the input gate G1 is also "1". Therefore, the degree of relation here is "1".

Figure 13B:
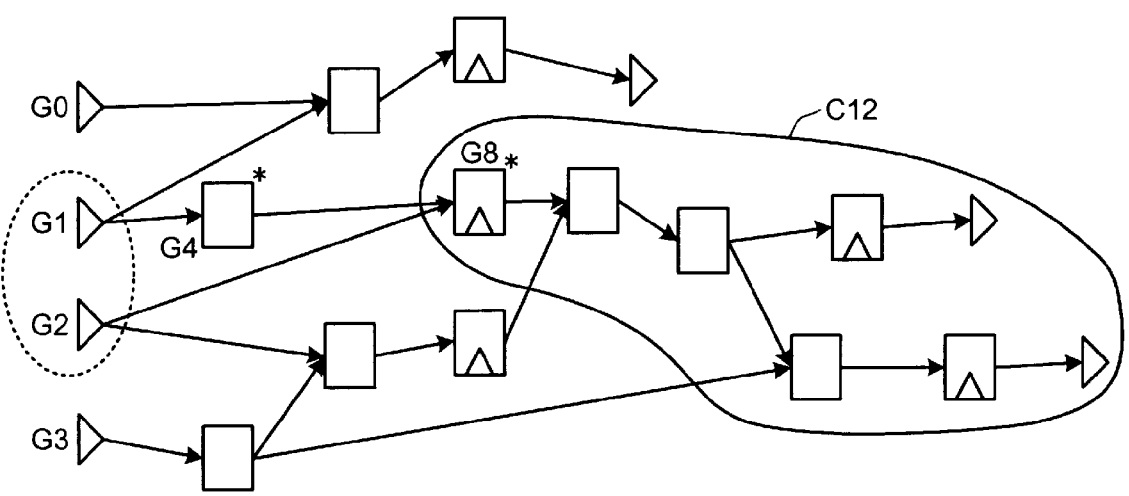

As depicted in FIG. 13B, the degree of relation between the input gates G1 and G2 is determined. Since the gate G8 is at the head of the common output cone C12, the number of gates from the input gate G1 is "2" and the number of gates from the input gate G2 is "1". Therefore, the degree of relation here is "2".

Figure 13C:
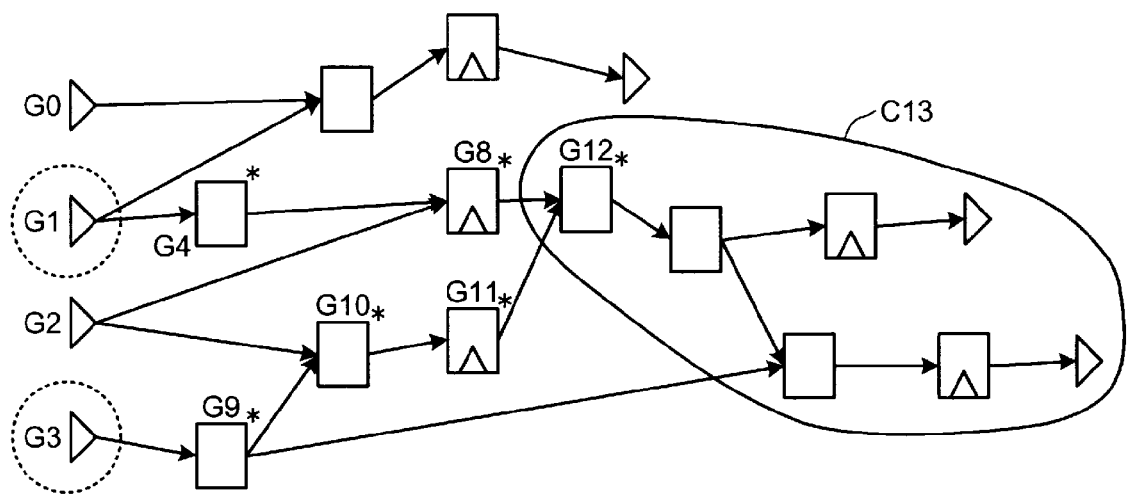

As depicted in FIG. 13C, the degree of relation between the input gates G1 and G3 is determined. Since the gate G12 is at the head of the common output cone C13, the number of gates from the input gate G3 is "3" and the number of gates from the input gate G3 is "4". Therefore, the degree of relation here is "4".

Figure 13D:
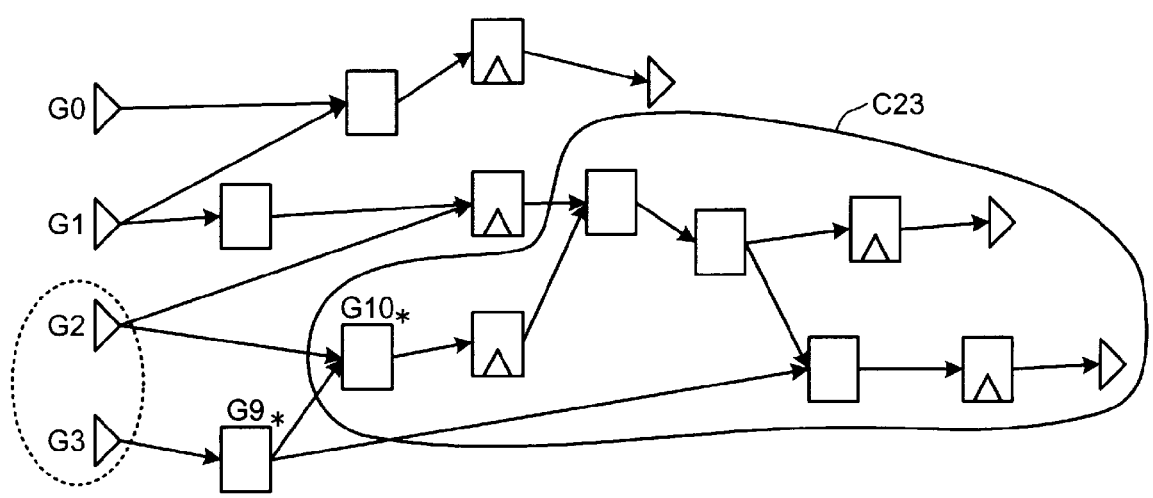

As depicted in FIG. 13D, the degree of relation between the input gates G2 and G3 is determined. Since the gate G10 is at the head of the common output cone C23, the number of gates from the input gate G2 is "1" and the number of gates from the input gate G3 is "2". Therefore, the degree of relation here is "2".

Figure 13E:
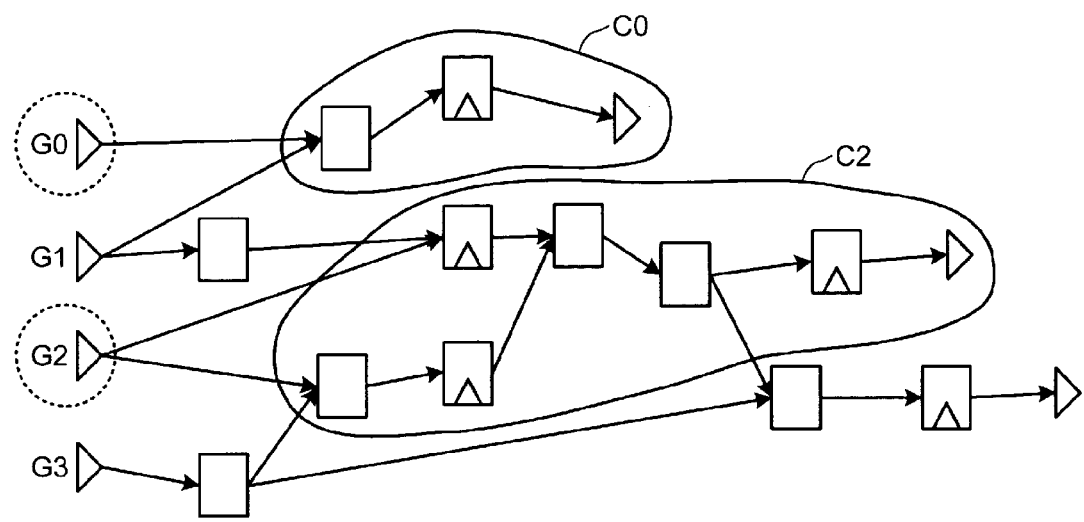

As depicted in FIG. 13E, the degree of relation between the input gates G0 and G2 is determined. Since the output cone C0 corresponding to the input gate G0 does not intersect the output cone C2 corresponding to the input gate G2, there is no common output cone. Therefore, the degree of relation here is "∞".

Figure 13F:
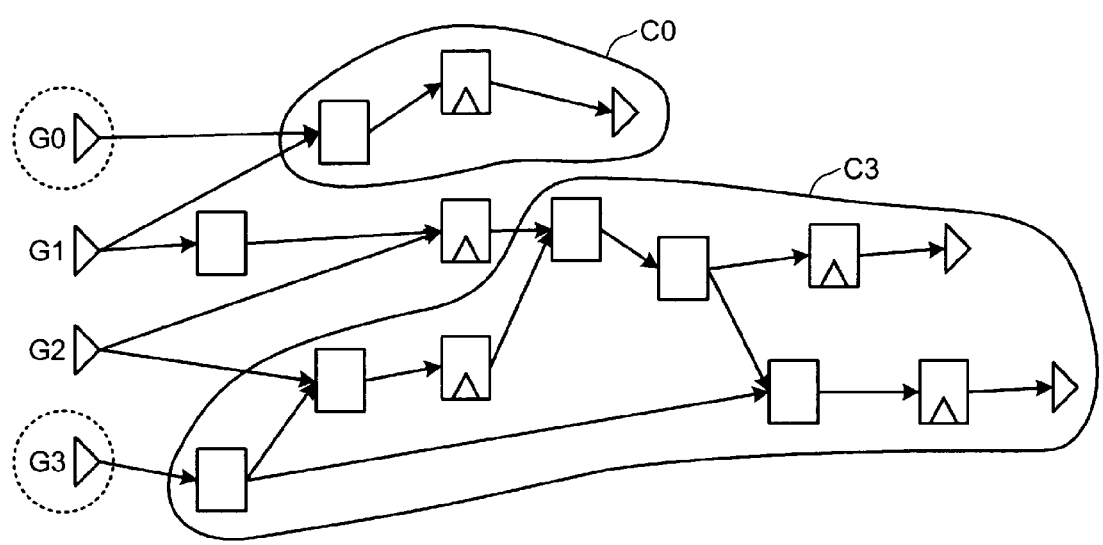

As depicted in FIG. 13F, the degree of relation between the input gates G0 and G3 is determined. Since the output cone C0 corresponding to the input gate G0 does not intersect the output cone C3 corresponding to the input gate G3, there is no common output cone. Therefore, the degree of relation here is "∞". The calculated degrees of relation are stored in a storage area such as the RAM 603, the magnetic disk 605, or the optical disk 607.

Depicted in FIG. 9, the determining unit 906 has a function of determining, for each of the combinations of input gates and based on a calculation result from the calculating unit 905, the strength of relation. The strength of relation is a relative evaluation index based on the degree of relation. Specifically, for example, the existence or absence of relation is determined by comparing a degree of relation with another degree of relation. For example, if there is no relation, the strength of relation between the input gates is regarded as "no relation".

Meanwhile, if there is a relation, the strength of relation for a combination of input gates having the maximum degree of relation is regarded as "strong". The strength of relation for other combinations of input gates is regarded as "weak". The existence or absence of relation is determined by a value of the degree of relation.

FIG. 14 is a diagram for explaining a result of determination on the strength of relation. In FIG. 14, a graph 1401 indicates the strengths of relation between the examples depicted in FIGS. 11A to 11F; a graph 1402 indicates the strengths of relation between the examples depicted in FIGS. 12A to 12F; and a graph 1403 indicates the strengths of relation between the examples depicted in FIGS. 13A to 13F.

In the graph 1401, the degree of relation becomes higher with an increasing number of gates. Therefore, the strength of relation is regarded as "no relation" for the combinations of input gates having a degree of relation of "0", (G0, G2) and (G0, G3). The strength of relation for the combination of gates (G2, G3) having the maximum degree of relation, is regarded as "strong". In addition, the strength of relation is regarded as "weak" for the combinations of input gates (G0, G1), (G0, G2), and (G0, G3).

Similarly in the graph 1402, the degree of relation becomes higher with an increasing number of registers. Therefore, the strength of relation is regarded as "no relation" for the combinations of input gates having a degree of relation of "0", (G0, G2) and (G0, G3). The strength of relation for the combinations of gates (G0, G1) and (G0, G2) having the maximum degree of relation, is regarded as "strong". In addition, the strength of relation is regarded as "weak" for the combinations of input gates (G0, G3) and (G2, G3).

Meanwhile in the graph 1403, the degree of relation becomes higher with a decreasing number of gates to a common output cone. Therefore, the strength of relation is regarded as "no relation" for the combinations of input gates having a degree of relation of "∞", (G0, G2) and (G0, G3). The strength of relation for the combination of gates (G0, G1) having the maximum degree of relation, is regarded as "strong". In addition, the strength of relation is regarded as "weak" for the combinations of input gates (G0, G2), (G0, G3), and (G2, G3). The determined strengths of relation are stored in a storage area such as the RAM 603, the magnetic disk 605, or the optical disk 607.

Further, in FIG. 9, the setting unit 907 has a function of setting specific strengths of relation with respect to combinations of input gates, the combination being based on the specification of the verification target. Specifically, the setting unit 907 automatically assigns specific strengths of relation to the combinations P1 to P3 that are based on the specification and described in the parameter file 502.

Here, for example, through analysis of the specification, the user judges the combinations of input gates P1 to P3 that are based on the specification described in the parameter file 502 as important combinations. Therefore, the strength of relation is set as "strong" for all these combinations. If the user concludes that "some relation exists but is less important", the user may set the strength of relation as "weak".

Moreover, if the user concludes that "there is no relation", the user may set the strength of relation as "no relation". Nonetheless, the user can arbitrarily set the strength of relation. The set strengths of relation are stored, in a storage area such as the RAM 603, the magnetic disk 605, or the optical disk 607, together with the combinations of input gates P1 to P3 that are based on the specification.

Further, depicted in FIG. 9, the judging unit 908 has a function of judging, for each of the combinations of input gates, whether the specific strength of relation set by the setting unit 907 and the strength of relation determined by the determining unit 906 coincide. Specifically, for example, the judging unit 908 judges whether the strengths of relation coincide for identical combinations of input gates, as depicted in FIG. 4.

If the strengths of relation coincide ("OK" in FIG. 4), it is understood that there is consistency between the specification and the implementation in terms of the combination of input gates. On the contrary, if the strengths of relation do not coincide ("warning" in FIG. 4) it is revealed that there is no consistency between the specification and the implementation in terms of the combination of input gates. Judgment results are stored in a storage area such as the RAM 603, the magnetic disk 605, or the optical disk 607.

The output unit 909 has a function of outputting the judgment results obtained by the judging unit 908. Possible forms of output include display on the display 608, printout from the printer 613, transmission to an external apparatus via the I/F 609, and storage in a storage area such as the RAM 603, the magnetic disk 605, or the optical disk 607.

FIG. 15 is a diagram for explaining judgment of coincidence of the strengths of relation for the combinations based on the specification and the strengths of relation represented by the graph 1401 depicted in FIG. 14, and output contents thereof. Section (A) in FIG. 15 depicts graphs for judgment of coincidence of the strengths of relation for the combinations of input gates based the specification and the strengths of relation indicated by the graph 1401 in FIG. 14. A graph 1500 depicts the strengths of relation for the combinations of input gates based the specification.

By comparing the graphs 1401 and 1500, it is revealed that the strengths of relation "strong" for the combination (G2, G3) coincide, the strengths of relation "no relation" for the combination (G0, G3) coincide, and the strengths of relation for the other combinations do not coincide. Section (B) in FIG. 15 depicts data 1501 output from the output unit 909. Data output from the output unit 909 includes content reflecting the determined coincidence, like that depicted in FIG. 15(A), and is output in a given format from the output unit 909.

FIG. 16 is a diagram for explaining judgment of coincidence of the strengths of relation for the combinations based on the specification and the strengths of relation represented by the graph 1402 depicted in FIG. 14, and output contents thereof. Section (A) in FIG. 16 depicts graphs for judgment of coincidence of the strengths of relation for the combinations of input gates based on the specification and the strengths of relation indicated by the graph 1402 in FIG. 14.

By comparing the graphs 1402 and 1500, it is understood that the strengths of relation "strong" for the combination (G0, G1) coincide, the strengths of relation "no relation" for the combination (G0, G3) coincide, and the other combinations do not coincide. Section (B) in FIG. 16 depicts data 1601 output from the output unit 909. Data output from the output unit 909 includes content reflecting the determined coincidence, like that depicted in FIG. 15(B), and is output in a given format from the output unit 909.

Figure 17:
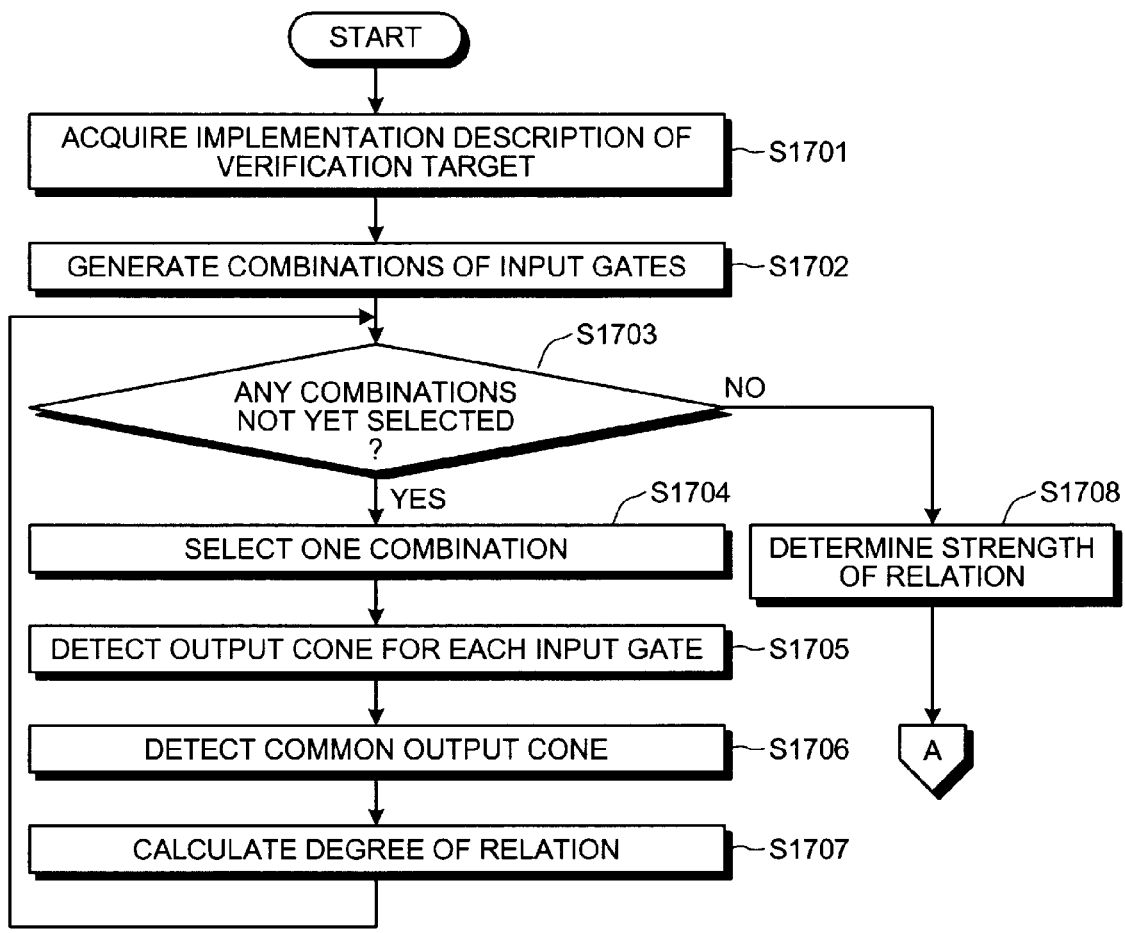
FIGS. 17 and 18 are flowcharts of a verification support process performed by the verification support apparatus.
Figure 18:
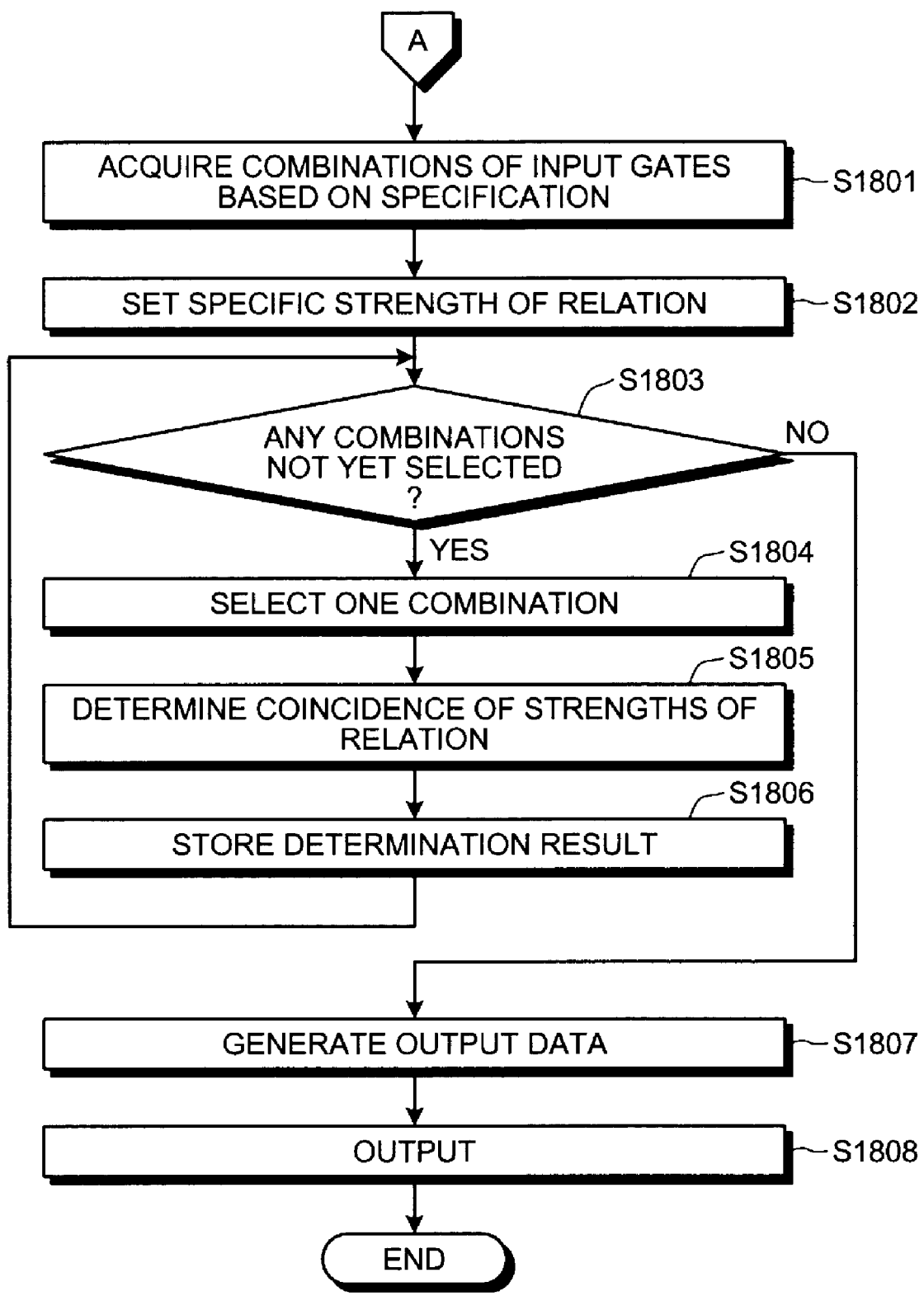

FIGS. 17 and 18 are flowcharts of a verification support process performed by the verification support apparatus 500. As depicted in FIG. 17, the acquiring unit 901 acquires the implementation description 501 of a verification target (step S1701). Next, the verification support apparatus 500 generates combinations of input gates from the contents of the implementation description 501 (step S1702). Then, the verification support apparatus 500 determines whether a generated combination of input gates that has not yet been selected remains (step S1703).

If there is a combination(s) that has not yet been selected (step S1703: YES), the verification support apparatus 500 selects one of the combinations (step S1704). Then, the first detecting unit 903 detects output cones for input gates making up the selected combination of input gates (step S1705). Subsequently, the second detecting unit 904 detects an output cone common to both the output cones detected by the first detecting unit 903 (step S1706).

The calculating unit 905 calculates, based on the detected common output cone, the degree of relation for the selected combination of input gates (step S1707), and the process returns to step S1703. On the contrary, if it is determined at step S1703 that no combinations remain (step S1703: NO), the determining unit 906 determines the strength of relation for each of the combinations of input gates (step S1708), and the process proceeds to step S1801 depicted in FIG. 18.

After step S1708, the verification support apparatus 500 acquires the combinations of input gates based on the specification, as depicted in FIG. 18 (step S1801). Then, the setting unit 907 sets the strengths of relation (e.g. "strong") for the acquired combinations of input gates (step S1802). The verification support apparatus 500 determines whether a combination of input gates that has not yet been selected remains (step S1803).

If a combination(s) remains (step S1803: YES), the verification support apparatus 500 selects one of the combinations (step S1804). Then, the judging unit 908 judges whether the strengths of relation determined based on the implementation (the strengths of relation obtained at step S1708) and the strengths of relation determined based on the implementation (the strengths of relation obtained at step S1802) coincide (step S1805).

Subsequently, the verification support apparatus 500 stores a determination result in a storage area (step S1806) and the process returns to step S1803. On the contrary, if the verification support apparatus 500 determines at step S1803 that no combinations remain (step S1803: NO), the verification support apparatus 500 generates data such as that depicted in FIGS. 17 and 18 (step S1807), and outputs the data from the output unit 909 (step S1808). The verification support apparatus 500 hereby terminates a sequence of processes.

According to the embodiment as stated above, it is possible to determine the validity of dependent relationships between input gates of combinations, as parameters. Therefore, it is possible to determine consistency between the input gate combinations based on the specification and the input gate combinations based on the implementation, and issue a warning concerning any inconsistent combination. Thus, the validity of dependent relationships between input gates of such combinations can be confirmed, and combinations of input gates (gates to which signals are applied), i.e., combinations generated based on the specification, can be corrected with the use of information extracted from the implementation. Thus, highly efficient and reliable logic verification can be realized.

The verification support method explained in the present embodiment can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A non-transitory computer-readable recording medium storing therein a verification support program that causes a computer to execute:
   acquiring an implementation description of a verification target;
   identifying, based on the implementation description, a combination of input gates of the verification target, the input gates each receiving an input signal;
   detecting a pair of output cones for the combination of input gates identified at the identifying, each of the output cones including gates that are of the verification target and to which input signals from the combination of input gates reach;
   detecting, for the combination of input gates, a common output cone that includes gates common to the pair of output cones detected at the detecting the pair of output cones;
   calculating, based on the common output cone detected at the detecting the common output cone, a degree of relation between the input gates making up the combination;
   determining, for the combination of input gates, a first strength of relation according to a calculation result at the calculating;
   setting a second strength of relation for a combination of the input gates, the combination being based on a specification of the verification target and corresponding to the combination identified at the identifying;
   judging whether the second strength of relation set at the setting and the first strength of relation determined at the determining coincide; and
   outputting a result of the judging.

2. The non-transitory computer-readable recording medium according to claim 1, wherein
   the calculating includes calculating based on a count of a specific kind of gate in the common output cone detected at the detecting the common output cone.

3. The non-transitory computer-readable recording medium according to claim 2, wherein
   the specific kind of gate is a memory element.

4. The non-transitory computer-readable recording medium according to claim 1, wherein
   the calculating includes calculating based on a gate count from each of the input gates of the combination to the most upstream gate in the common output cone detected at the detecting the common output cone.

5. The non-transitory computer-readable recording medium according to claim 1, wherein
   the setting includes setting the first strength of relation to be identical to a strength of relation for a combination of input gates having the maximum degree of relation among combinations of the input gates.

6. A verification support apparatus comprising:
   an acquiring unit that acquires an implementation description of a verification target;
   an identifying unit that indentifies, based on the implementation description, a combination of input gates of the verification target, the input gates each receiving an input signal;
   a first detecting unit that detects a pair of output cones for the combination of input gates identified by the identifying unit, each of the output cones including gates that are of the verification target and to which input signals from the combination of input gates reach;
   a second detecting unit that, for the combination of input gates, detects a common output cone that includes gates common to the pair of output cones detected by the first detecting unit;
   a calculating unit that, based on the common output cone detected by the second detecting unit, calculates a degree of relation between the input gates making up the combination;
   a determining unit that, for the combination of input gates, determines a first strength of relation according to a calculation result from the calculating unit;
   a setting unit that sets a second strength of relation for a combination of the input gates, the combination being based on a specification of the verification target and corresponding to the combination identified by the identifying unit;
   a judging unit that judges whether the first strength of relation set by the setting unit and the second strength of relation determined by the determining unit coincide; and
   an output unit that outputs a result of the judging unit.

7. A verification support method, using a computer, the method comprising:
   acquiring an implementation description of a verification target;
   identifying, based on the implementation description, a combination of input gates of the verification target, the input gates each receiving an input signal;
   detecting a pair of output cones for the combination of input gates identified at the identifying, each of the output cones including gates that are of the verification target and to which input signals from the combination of input gates reach;
   detecting, for the combination of input gates, a common output cone that includes gates common to the pair of output cones detected at the detecting the pair of output cones;
   calculating, using the computer, based on the common output cone detected at the detecting the common output cone, a degree of relation between the input gates making up the combination;
   determining, for the combination of input gates, a first strength of relation according to a calculation result at the calculating;
   setting a second strength of relation for a combination of the input gates, the combination being based on a specification of the verification target and corresponding to the combination identified at the identifying;
   judging whether the second strength of relation set at the setting and the first strength of relation determined at the determining coincide; and
   outputting a result of the judging.

* * * * *